United States Patent [19]
White

[11] Patent Number: 5,676,205
[45] Date of Patent: Oct. 14, 1997

[54] QUASI-INFINITE HEAT SOURCE/SINK

[75] Inventor: Gregory W. White, San Carlos, Calif.

[73] Assignee: Applied Materials, Inc., Santa Clara, Calif.

[21] Appl. No.: 145,459

[22] Filed: Oct. 29, 1993

[51] Int. Cl.$^6$ .............................. F25B 29/00; H01J 37/32; H01L 21/00
[52] U.S. Cl. .............................. 165/275; 165/80.4; 165/96; 118/715; 118/725; 156/345; 204/298.07; 204/298.33
[58] Field of Search ................... 165/31, 32, 96, 165/275; 118/725, 715; 156/345; 204/298.07, 298.33

[56] References Cited

U.S. PATENT DOCUMENTS

| | | | |
|---|---|---|---|
| 3,270,802 | 9/1966 | Lindberg | 165/32 |
| 3,450,196 | 6/1969 | Bauer | 165/32 |
| 3,602,004 | 8/1971 | Peavler | 165/96 |
| 4,689,970 | 9/1987 | Ohguma et al. | 165/32 |
| 4,771,823 | 9/1988 | Chan | 165/96 |
| 5,096,536 | 3/1992 | Cathey, Jr. | 156/643 |
| 5,290,381 | 3/1994 | Nozawa et al. | 118/725 |

FOREIGN PATENT DOCUMENTS

| | | |
|---|---|---|
| 0323620 | 12/1988 | European Pat. Off. |
| A488307 | 11/1991 | European Pat. Off. |
| 4-352338 | 12/1992 | Japan ............ 118/725 |
| WO9220098 | 7/1991 | WIPO |

Primary Examiner—John K. Ford
Attorney, Agent, or Firm—Janis Biksa

[57] ABSTRACT

An apparatus and method for controlling the temperature of an object, in particular a semiconductor wafer support structure in a wafer processing chamber. A gas gap is created between the two adjacent objects of different temperatures. The pressure in the gap is adjusted to control the thermal conductivity of the gas between the two structures. To have a large heat flow between the two objects so that their temperatures can be closely matched, the pressure is increased. To maintain the temperature of the object sought to be controlled regardless of the temperature of the adjacent item (heat source/sink) the pressure is reduced to a strong vacuum (acting as insulation) so that very little heat flow occurs through the gas gap. Localized control acts together with a local heat sink to precisely control the temperature of a semiconductor support structure pedestal/cathode to maintain the uniformity of the temperature of the wafer during processing to prevent wafer surface process anomalies due to variations and gradients in temperature. Heating and cooling in one structure can be controlled by using alternating gas gaps. A heating heat source/sink is placed adjacent to a cooling heat sink/source both of which face the object whose temperature is to be controlled.

13 Claims, 10 Drawing Sheets

QUASI-INFINITE HEAT SOURCE/SINK

FIELD OF THE INVENTION

This invention relates to controlling the temperature of an object, e.g., a cathode or wafer pedestal in a silicon wafer processing chamber, by varying the thermal conductivity of a gas in a narrow gap between the object and a heat source/sink.

BACKGROUND OF THE INVENTION

When processing silicon wafers, a good product requires surface uniformity. Achieving surface uniformity, whether in deposition or removal processes is very much dependent on and proportional to the silicon wafer temperature and any thermal gradients that it experiences during processing operations, such as etching and deposition. Changes in the temperature of the wafer cause changes in the rate of activity at the wafer's surface. When a wafer's temperature varies outside desired process temperature ranges, the deposition or etching of surface layers can lead to anomalies in the surface condition and unacceptable roughness.

To avoid exceeding process temperature limits and help maintain temperature uniformity, cooling and/or heating fluids are often circulated through the process chamber members adjacent to/or in contact with the wafer being processed to add or remove energy to help maintain the process temperature within its limits.

In these systems, a change in temperature of an etch cathode requires that the temperature of all the circulating liquid in the heat exchanger, fluid lines, and cathode be changed. While large energy input can dramatically change local temperatures, resistance to such changes can be hampered by the fact that the temperature of all the fluid must change before the localized temperature increase due to localized energy input can be overcome. The rate at which the temperature of the entire system can change is governed by the rate at which energy can be input/withdrawn from the entire system by the heater/refrigerator unit.

An example of an existing temperature control system is shown in FIG. 1. A thermal reservoir 27 containing a thermal transfer fluid (often a chemically treated water) is heated or cooled by a heating/refrigerating unit 28 which is controlled within process limits by a controller 29 to maintain the temperature sensed by a temperature sensor 22 at the discharge of a circulating pump 21. The thermal transfer fluid is circulated through the wafer processing chambers 25, 26 by means of thermal fluid lines 23. The wafers 30 in the wafer processing chambers 25, 26 rest on support pedestals having a cooling fluid 31 passing through them. In one configuration (which minimizes the cooling fluid flow rate, pump size, and piping size), a single fluid flow line passes in series through several wafer processing chambers. When there is an insufficient cooling flow or a high energy input from the chambers, it is possible that the wafer processing chambers near the end of the cooling loop which passes through these chambers in series will not be able to cool these last chambers sufficiently to maintain desired process temperatures.

As an alternative, a parallel cooling flow system is sometimes used (as shown by the dashed lines 24 representing alternate thermal fluid lines) so that fluid at the set temperature (as detected by the thermal sensor 22 at the discharge of the circulating pump 21) is sent to the inlet of each wafer processing chamber and each wafer processing chamber receives the same temperature thermal transfer fluid at its inlet.

In these systems the only way to change the temperature of the thermal transfer fluid is by heating or cooling the mass of the large thermal reservoir 27. Since this thermal reservoir 27 is at some distance from the actual wafer processing chambers 25, 26, there is a time delay between detecting changes in temperature of the fluid and heating or cooling, as appropriate, the fluid to return the fluid temperature to its desired range.

While handling and loading the wafer into the processing chamber, the wafer is at ambient temperature, unless heated. A spike in the temperature is experienced and is most noticeable after wafer handling and loading are complete and process energy (RF current) is suddenly engaged.

A heater/refrigerator is used in the thermal transfer fluid reservoir to heat the fluid which heats the wafer before the RF current is applied, and cools the fluid and wafer once an RF current is applied, to the wafer/pedestal/cathode in the wafer processing chamber. The RF current applies a tremendous energy input (approximately 1,000 watts) causing an immediate increase in local temperatures. The wafer processing temperature can spike wildly until it finally settles down as the wafer temperature reaches a steady state. Re-heating the thermal transfer fluid to approximately 90° to 100° C. reduces the initial thermal shock of initially applying the RF and reduces wafer surface temperature process variations. However, once the RF current is applied with its large influx of energy tending to drive the temperature up, the heated transfer fluid must quickly be cooled so that it becomes cooling transfer fluid to maintain the wafer pedestal and surface temperature at a steady state close to 100° C. during the wafer processing cycle. The speed at which the transition from heating to cooling can take place is hampered by the relatively large mass of fluid in the reservoir, all of which must be cooled to the desired cooling temperature; or a second cooled reservoir must be used. The heat capacity of the piping also hampers a rapid transition. Once a temperature change is needed, the fluid at the changed temperature must first flow through the length of all the feed piping, while changing its temperature, before finally reaching the process chamber. During the transition to cooling, large temperature gradients can and do occur in the wafer processing chambers which in turn can result in undesirable wafer surface conditions which can cause all or portions of the wafer to be rejected.

Due to the large electrical currents and fields present in the cathode, the use of a generally conductive, somewhat corrosive, and easily available transfer liquid, i.e., treated water, within the cooling liquid passages in the electrical path of the cathode, often causes the corrosion of the cooling passages to be accelerated. As a result the cathode has to replaced regularly to avoid process failure due to corrosion.

FIG. 2 shows a partial cross-section view of a wafer 38 in a typical wafer processing-etch chamber 36. The wafer 38 is held down on a wafer pedestal 39 by clamping fingers 41 extending from a wafer hold-down clamp ring 40. The pedestal 39 is supported by a pedestal support base 42 which has cutouts in it so that a wafer lift frame supporting wafer lift fingers 43 can raise the wafer from the pedestal during the wafer transfer/movement cycle. A bellows 45 supports the wafer lift frame 44 and seals the etch chamber 36 within the etch chamber wall 37 to provide a tight seal. A lift actuator 47 mounted outside the wafer processing chamber actuates the lift fingers to lift the wafer when desired. A cooling water connection (not shown) is also provided to cool the pedestal support base and the pedestal bolted to it during processing. FIG. 2A shows an exploded view of these identified components as well as some other components which are used in the assembly, they are: a quartz cover ring 40a, an insulator 40b, and a clamp ring cylinder 40c.

FIG. 3 shows a schematic exploded diagram of a wafer support base 56 having cut outs therein to receive a wafer lift frame 54 having wafer lift fingers 55 which support and protrude through a pedestal-cathode 53 to support a wafer 52.

These heating/cooling systems waste energy and do a marginal job of controlling the temperature of wafers during transitions from an energy (temperature) deficit ambient condition to an energy (temperature) surplus operating condition. The slow reaction and adjustment of the wafer heating/cooling system to accommodate process temperature variations is undesirable and can create unacceptable non-uniformities in the wafers being processed.

SUMMARY OF THE INVENTION

This invention provides for a rapidly adjustable controllable conduction between adjacent objects by controlling the pressure of a gas in a gap between the two objects. In a semiconductor processing environment, a very small gap is created between a wafer support member (a pedestal and/or other associated members) and a local heat sink-slug. The heat sink-slug is maintained at a relatively constant temperature by ambient conditions or by an external circulating heating/cooling system similar to that described in the Background of the Invention. The small gap between adjacent pieces is filled with one or more of several gases, preferably of low molecular weight gases and high thermal conductivity. The small gap space is connected via a gas passage to a pressure regulating mechanism. To transfer energy from one member to the other for either heating or cooling, the pressure of the gas in the gas gap is increased. The high concentration of gas at high pressures (1–3 atm.) in the small gas gap space, e.g., ~0.001"–0.003" (~0.03–0.08 mm), causes the gas to efficiently transfer the energy from the hot adjacent member to the cool one. To minimize thermal conduction between members, the gas gap is evacuated to a very low pressure (approaching a vacuum), and the low concentration of gas in the gap acts as a good insulator.

When both the heating and the cooling of a given object (such as a wafer pedestal) may be required at different times, separate heated and cooled heat sources and sinks can be attached to the object. The respective surface areas of the heat sources and sinks are separately sealed to create separate gas gap spaces adjacent to the heated and cooled source and sink (pedestal support base). By separately controlling the pressure of the gas in the two gaps the heat source and sink can be used alternately, one as a heater and the other as a refrigerator. Thus to heat an object such as a wafer pedestal, the heat source gap is pressurized and the temperature of the wafer pedestal increases, while at the same time the pressure of gas in the cooling heat sink gap is reduced to reduce thermal conductivity. The pedestal is then heated because heat transfer from the heat source to the pedestal is facilitated while heat loss into the heat sink is inhibited. Alternately, to cool the pedestal, the pressure of the gas in the heat sink gas gap, adjacent to the cooled sink (pedestal support base), is increased so that there is good thermal conduction across the gas gap and the pressure of the gas in the heat source gas gap is reduced to minimize thermal conductivity. The wafer pedestal is then cooled, since heat transfer from the pedestal into the cooled sink is facilitated, while heat transfer from the heat source into the pedestal is inhibited.

The rate of heat transfer (heating/cooling) can be controlled by infinitely adjusting the pressure of the gas gap to achieve slow or fast heating or cooling as desired to maintain temperature. This structure and method which controls the gas pressure in the gas gaps remotely, has a nearly immediate effect on the amount of energy input or removed from the wafer pedestal and therefore provides smooth and close control of the temperature of the wafer pedestal.

The gas gap may be sealed by welding a stainless steel (low thermal conductivity) band across the gap between the wafer pedestal and its adjacent heat source/sink and/or by clamping O-rings in the gap.

Circulating heat transfer fluid through the local heat source/sink makes the effective heat capacity of the local heat source/sink enormous. This decreases the time needed to cause changes in thermal input so that the temperature of the wafer pedestal during wafer processing can be maintained much more evenly than previously possible.

When the adjustment of gas gap pressure (generally directly proportional to thermal conductivity at low pressures and proportional according to a ⅔ order at higher pressures) is made by a servo-control system, the actual temperature of the local heat sink or source is of little importance. The servo-control will automatically adjust the gas gap pressure (thermal conductivity) to control the temperature of the wafer pedestal at a preset desired temperature.

The rate of thermal conductivity between adjacent members across a gas gap is dependent on the members' surface area which is available to interact with the gas in the gap. To increase the thermal conductivity over a given area it is advantageous to increase the surface area of adjacent members by constructing these members' mating surfaces with sawtooth or ridge-valley patterns. A 60° sawtooth increases the available surface area by 100% (a 45° by 42%).

To avoid losing the low molecular weight gases used for thermal conductivity, an expandable closed system can be used. This closed system includes the gas gap, a small narrow (low volume) passage to an external location, and a bellows mounted at the external location sealed to the small narrow passage to make a closed system. The bellows can then be expanded or compressed either mechanically or by gas pressure to increase or decrease the volume, and then decrease or increase the pressure, of the closed system. The small volume of the gas gap and passage allows the change in bellows volume to adjust the closed system pressure through a very wide variety of pressures. Extending the bellows causes a high vacuum (down to several torr) to be achieved, while compressing the bellows causes a high pressure (as high as several atmospheres) to be achieved.

When hydrogen is used as the thermally conducting gas the use of bellows may be avoided by providing a closed fixed size cheer attached to the gas passage having palladium media therein. Hydrogen adsorbs to palladium and can be driven off when the palladium is heated. The chamber can be left unheated to achieve high levels of vacuum and can be heated to drive the hydrogen off the palladium to achieve high pressures as required for high thermal conductivity.

It is also possible to use direct gas pressure from gas cylinders, or the like, and connections to a vacuum source to achieve the types of gas pressures and thermal conductivities required. However, some types of gases which are economical and usually available (nitrogen, argon) do not have thermal conductivities which efficiently transfer energy across a gas gap compared to gaps filled with gases ($H_2$, He) having higher thermal conductivities.

The local control of temperature by varying the thermal conductivity of the gas gap between adjacent elements at different temperatures is highly effective and suitable for maintaining much more accurate control of the temperature of members participating in semiconductor wafer processes, despite rapid changes in ambient heat and temperature conditions in varied rigorous processing applications. The invention is particularly advantageous for a large object or one with a large thermal mass which must be maintained at a relatively even temperature despite large inputs or removals of thermal energy. It is also equally applicable regardless of the material from which the object to be controlled is constructed; for example, the object can be of metal or ceramic and may even include liquid.

A BRIEF DESCRIPTION OF THE DRAWINGS

DETAILED DESCRIPTION

Figure 1:
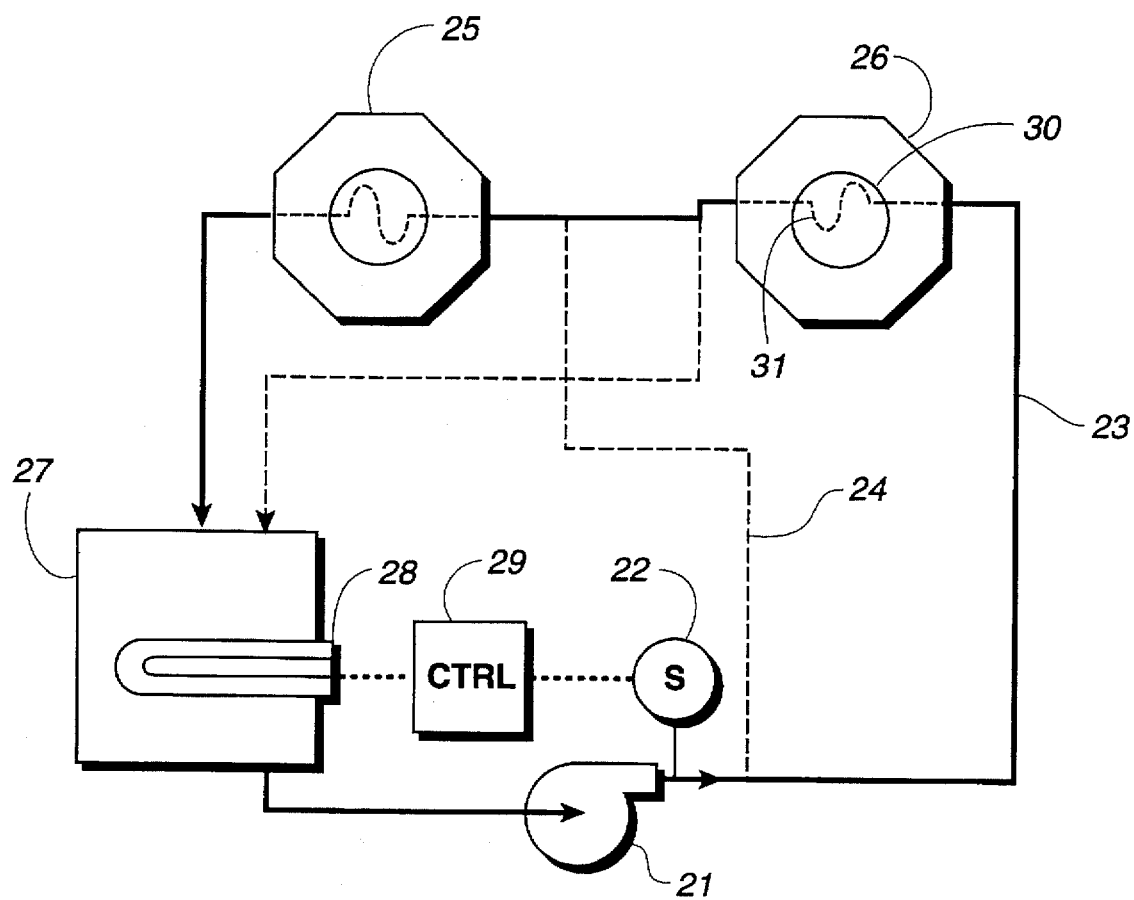
FIG. 1 is a schematic diagram of a prior art cooling system for several semiconductor (wafer) processing chambers.
Figure 2:
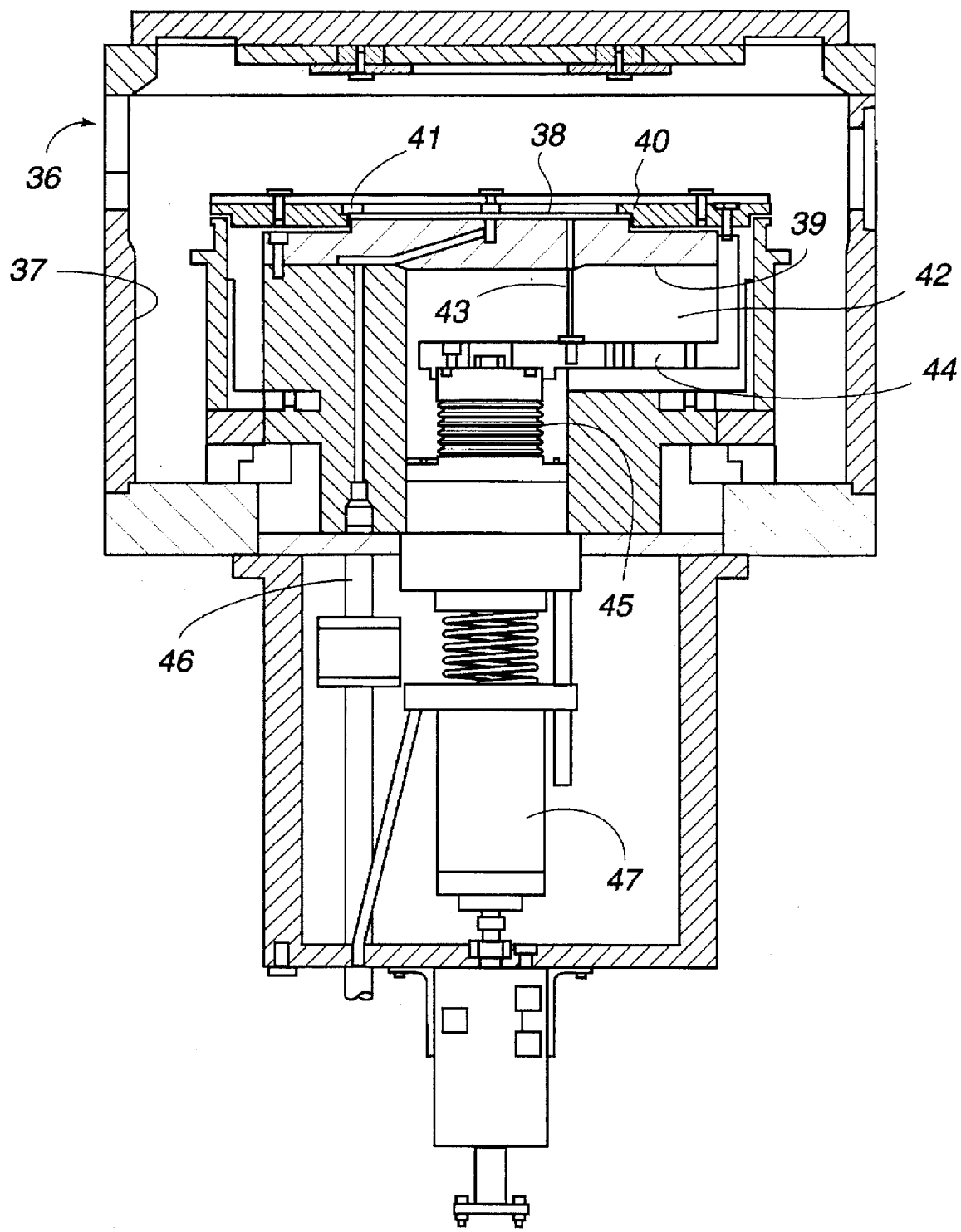
FIG. 2 is a cross-sectional view of a prior art wafer processing chamber used for etching.
Figure 2A:
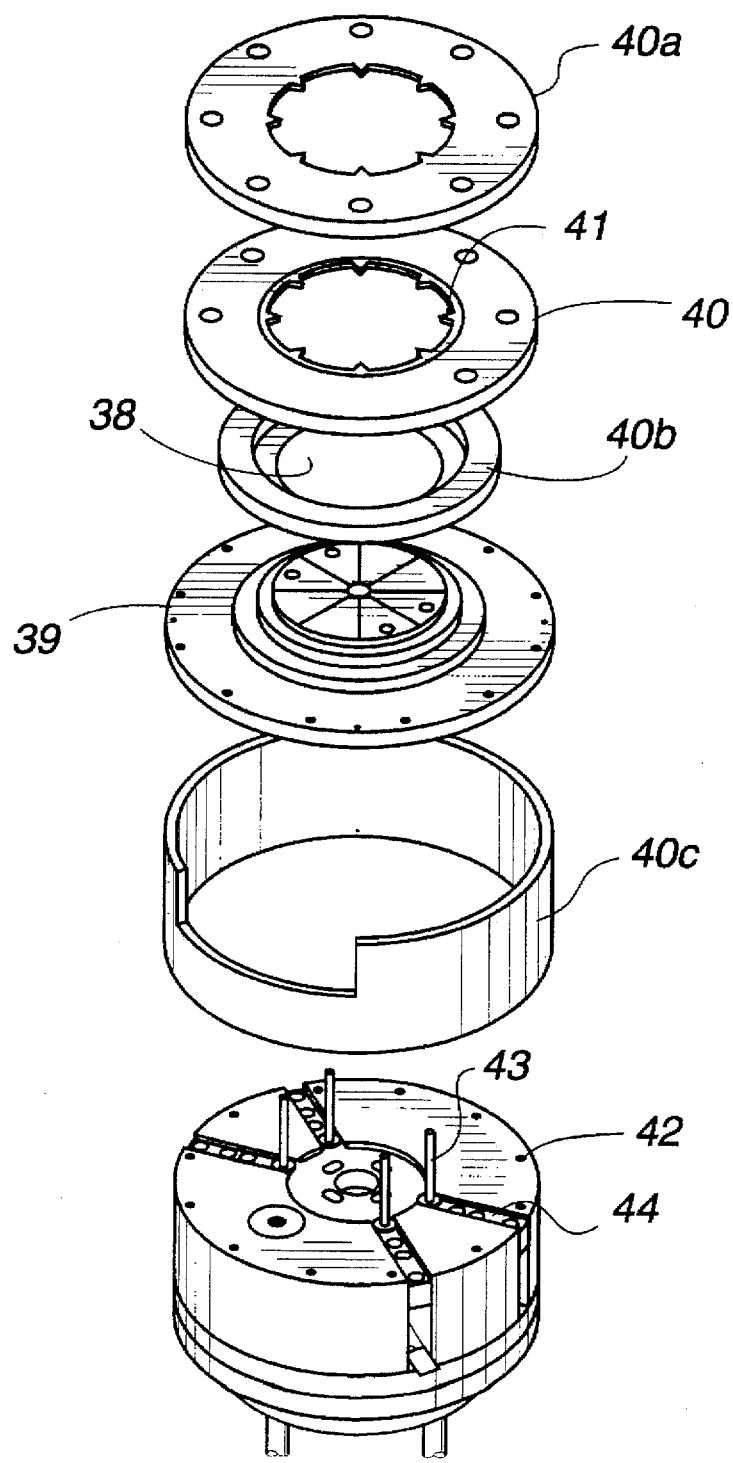
FIG. 2A is an exploded view of the items shown in FIG. 2.
Figure 3:
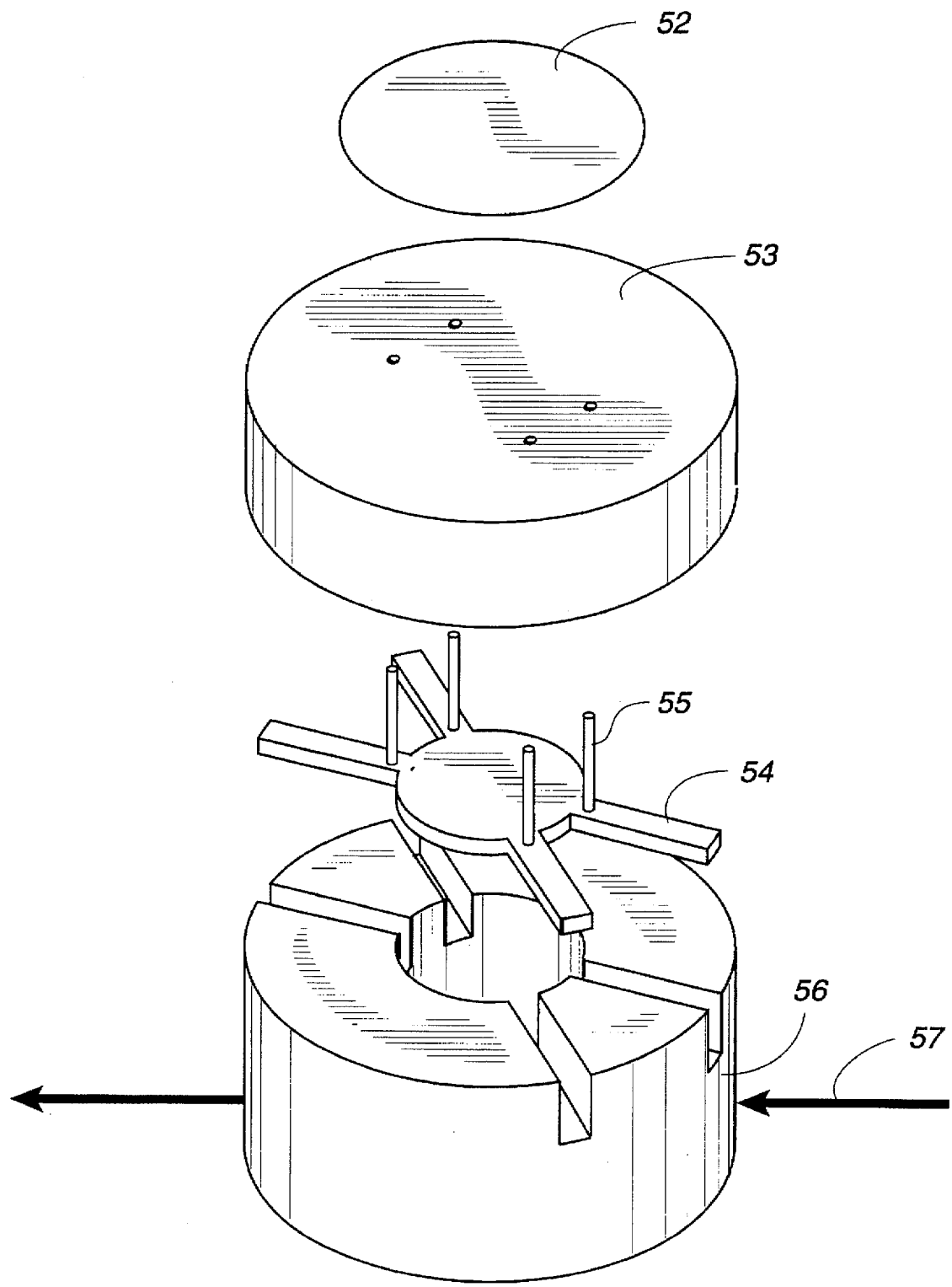
FIG. 3 is a perspective view of a wafer shown above a prior art pedestal, pedestal support, and a wafer lift finger frame.

As will be described in detail below, this invention may be used to control the temperature of any object having a thermal mass whose temperature varies because it is subject to changes in thermal energy input. The temperature control is achieved using a sealed space (gap) filled with a gas, preferably of low molecular weight, a "local" heat source/sink, and preferably, though not necessarily, a global heat source/sink, and a temperature controller to control the temperature. The sealed space (gap) is created between the object whose temperature is to be controlled, and the local heat sink. The gas is contained in this gas gap. Varying the pressure of the gas in the gas gap smoothly varies the thermal conductivity across the gas gap. Varying the thermal conductivity across the gap can control the temperature of the object (e.g. a pedestal supporting a semiconductor wafer), as long as the thermal conductivity of the gas gap is the factor limiting heat transfer between adjacent members. This will be the case so long as a temperature differential exists in the proper direction. The advantage of this variable thermal conductivity is that a separate "global heat source/sink" may be coupled to the local heat source/sink (e.g. by fluid conduits), and can be run with a crude temperature control system to maintain the local heat source/sink at a differential temperature with minimal variation. Meanwhile the thermal conductivity controller finely adjusts the temperature of the object. It can do so notwithstanding any swings in temperature of the global heat source/sink, and accordingly of the local source/sink itself.

More than one local heat sink/source may be coupled to the metal whose temperature requires control. When using both a heat sink and a heat source simultaneously, each for one function only, the temperature of the object can be easily controlled to a preselected temperature lying between the sink and source temperatures. Using both a heat sink and a heat source simultaneously in accordance with the invention provides the significant advantage that the temperature of a substantial object, such as a pedestal/cathode can be changed without changing the temperature of the heat transfer media (oil, water, etc.). The rate at which such a pedestal can change temperature is then dependent only on the thermal conductivity of the gas gap space, the heat capacity of the local heat sink and the capacity of the local heat source.

The capacity of the local heat source/sink can be made very large, by making it hollow and having the heat exchange fluid circulate within it. The effective heat capacity of the local heat source/sink is thus enormous, hence a "quasi-infinite" heat source/sink. And regardless of whether the local heat source/sink is hollow or not, its effective heat capacity can likewise be increased greatly by circulating the heat exchange fluid to an outside source of heating or cooling to supply or subtract heat, to any required degree, to the local heat sink/source to stabilize its temperature.

Figure 4:
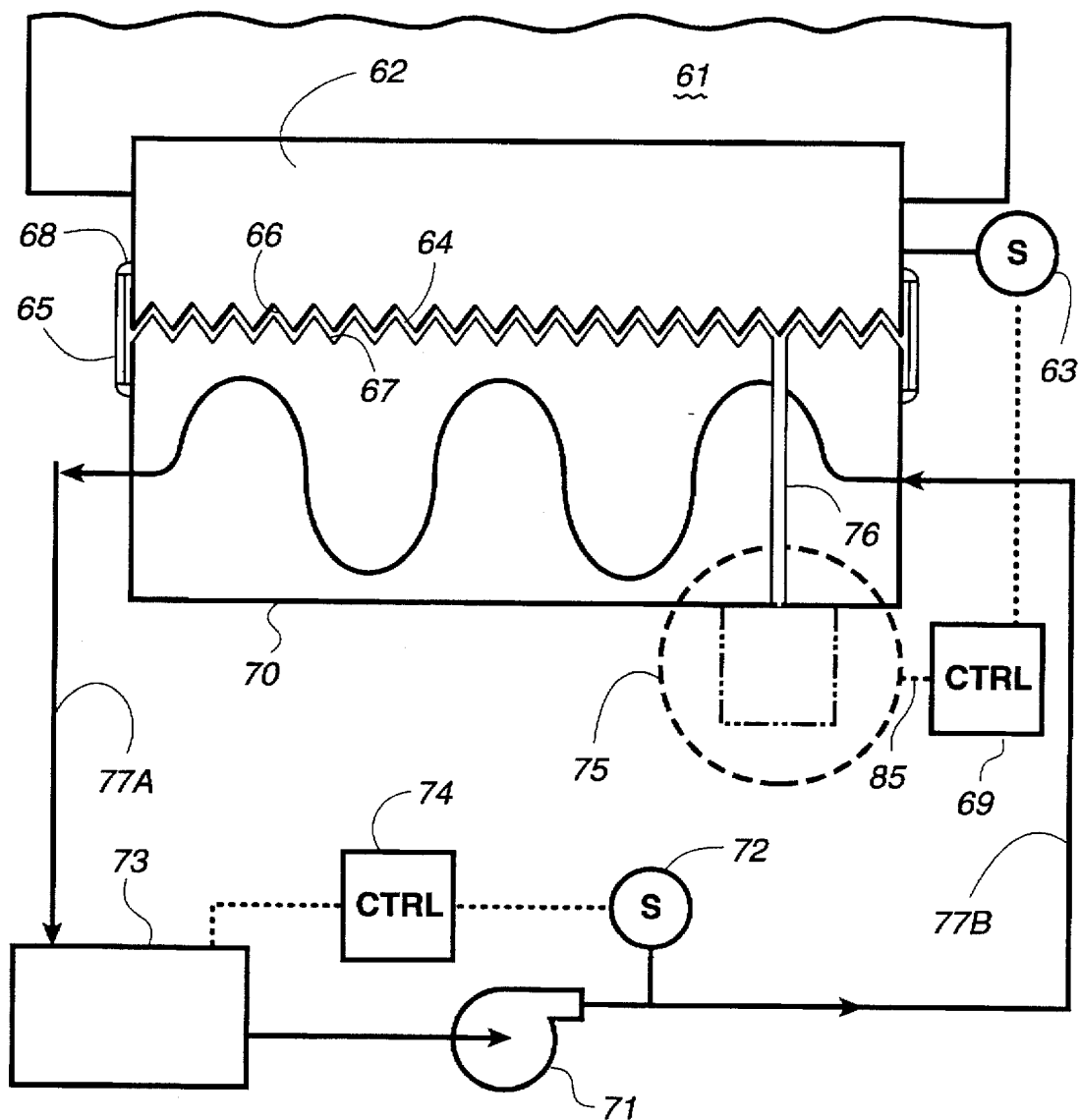
FIG. 4 is a schematic diagram of an etch chamber and wafer pedestal support according to the invention.

An embodiment of the invention as applied to semiconductor wafer processing is shown in FIG. 4. A metal object 62 whose temperature is to be controlled (such as a wafer support pedestal/cathode in a wafer processing chamber) is sealed in and supported in etch chamber 61. Although it may also be planar or of some other configuration, the lower surface of the pedestal 62 is constructed in a series of concentric circular ridges and valleys creating a sawtooth pattern 66 across the bottom surface of the pedestal 62. A pedestal base 70 (acting as a local heat source/sink) has a surface of configuration matching the pedestal lower surface, in this case, an upper sawtooth surface 67 to mate with the lower sawtooth surface 66 of the pedestal 62. These pieces are mated, but maintain a gap of 0.001"–0.003" (0.03 to 0.08 mm) providing a small gas volume over a large area therebetween. The members are constructed of a material (e.g. aluminum) with sufficient rigidity so that there will be no contact at any point with the other member. A sealing ring 65 (made of a 3XX series stainless steel although many common sealing materials and other metals could be used)

will provide the sealing of the edge of the surfaces particularly when sealed by weld 68. Other sealing expedients such as O-rings and bolting together the pedestal base 70 and pedestal 62 could be used as well. The containment uses preferably low molecular weight gases, such as hydrogen, helium, neon, and nitrogen. These gases are advantageous because they have high thermal conductivities compared to other gases; however, most other gases would also work, but probably not as effectively.

Figure 5A:
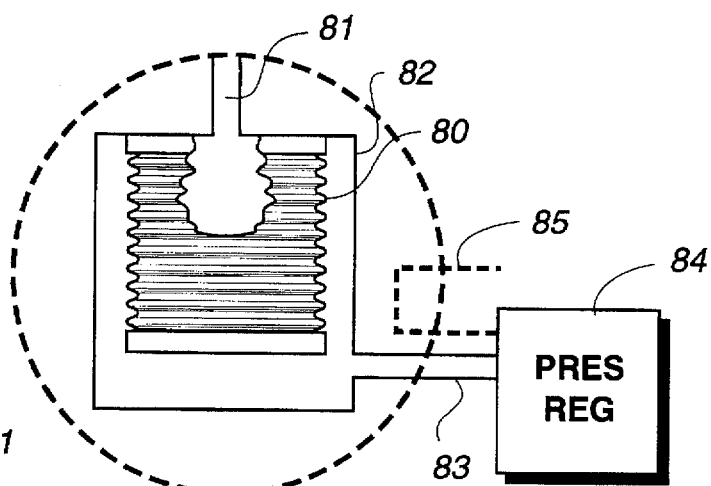
FIG. 5A is a detailed schematic diagram of FIG. 4 showing the use of an enclosed bellows for controlling pressure according to the invention.

The gas gap 64 is connected by a passage 76 to a pressure control mechanism 75. One example of a pressure control mechanism 75 is shown in FIG. 5A. The passage 81 correlates to the passage 76 shown in FIG. 4. A bellows 80 is sealed to the end of the passage 81 to contain the gas used in the gas gap 64 in a closed system. When the bellows is expanded the concentration of gas in the gas gap and in the bellows is rarefied and a low pressure (a very high vacuum of ~1–10 torr) might be achieved. On the other hand when the bellows is compressed, thereby compressing the gas in the closed system, a pressure as great as 3 atmospheres may be achieved. The pressures achieved are a function of on the volume of the closed system and the changes in volume of the bellows. The bellows as shown in FIG. 5A is manipulated by its being contained in a bellows enclosing chamber 82 connected by a passage 83 to a pressure regulator 84. Apart from minimal bending resistance in the bellows pleats, the pressure inside the bellows will generally equal the pressure outside the bellows. Therefore, regulating the pressure in the bellows enclosing chamber 82 by the pressure regulator 84 will directly adjust the pressure in the gas gap 64.

The temperature of the pedestal 62 (FIG. 4) is sensed by a temperature sensor 63. The temperature sensor 63 sends a signal to a temperature controller 69 which in turn provides a control signal over line 85 which is a function of the detected temperature to the pressure control mechanism 75 (pressure regulator 84 as shown in FIG. 5A). Higher gas pressure in the gap will cause higher thermal conduction across the gap while lower gas pressure in the gap will alternate such thermal conduction. Such change in the pressure in accordance with the sensed temperature can then change the temperature of the pedestal in accordance with the control signal.

While the foregoing system requires only the local heat source/sink 70 to control the temperature of pedestal 62, the local heat source/sink 70 has a much greater effect when it is connected to a global heat source/sink 73. The connection can be via fluid conduits 77A and 77B so that global heat sources/sinks can be located remotely from pedestal 62 and local heat source/sink 70. Fluid is circulated between local and remote sinks by means of a circulating pump 71 through a heat exchanging passage in the local heat source/sink 70. The temperature of the fluid as sensed by a second temperature sensor 72 is then controlled by a second controller 74 which controls the temperature of the global heat source/sink 73, and as a result also controls the temperature of the local heat sink/source 70. Using this system, neither large temperature variations in the thermal transfer fluid nor delays in building up or taking down the temperature of the global heat source/sink, will have much of an effect on the temperature of the pedestal 62, as the controller 69, in conjunction with the pressure control 75 will have already adjusted the thermal conductivity between pedestal 62 and local heat sink 70 to do its best to maintain the temperature of the pedestal 62. However, the ability of the local temperature controller 69 to control the temperature of pedestal 62 will be dependent on the existence of a temperature difference between the local heat source/sink 70 and the pedestal 62, since a temperature difference is required for there to be heat flow. The transfer of heat between global heat source/sink 73 and local heat source/sink 75 can be controlled within rougher limits by the second temperature sensor 72 to maintain such a temperature difference, and to maintain the temperature source/sink 70 with minimal variation. For example, it will often suffice to utilize pulse width modulation to control global heat sink 73, for example merely to turn on or off a source of heat for any required time.

Figure 5B:
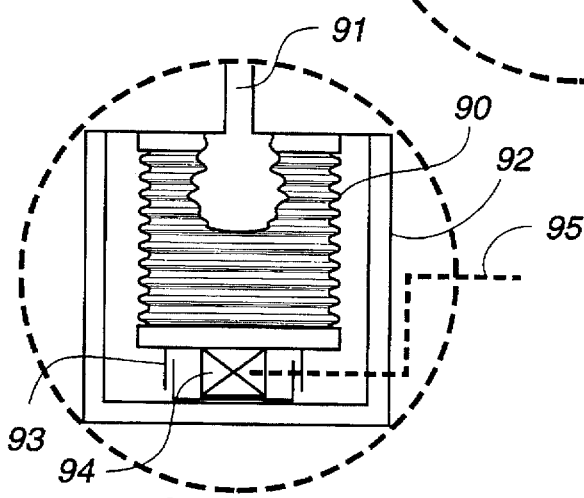
FIG. 5B is a detailed schematic diagram of FIG. 4 showing mechanical bellows manipulation for controlling pressure according to the invention.
Figure 5C:
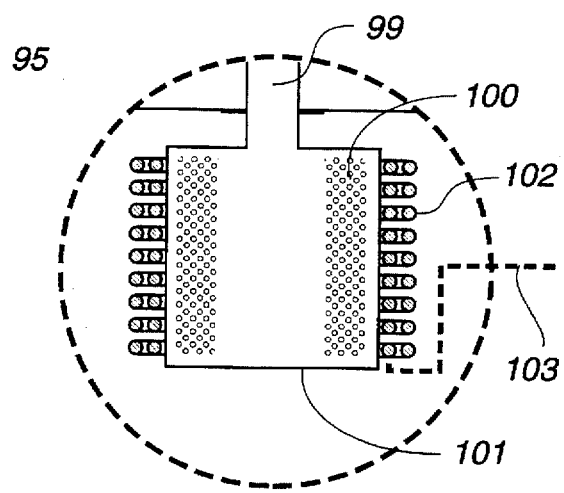
FIG. 5C is a detailed schematic diagram of FIG. 4 showing the use of an adsorptive material in a chamber for controlling pressure according to the invention.
Figure 5D:
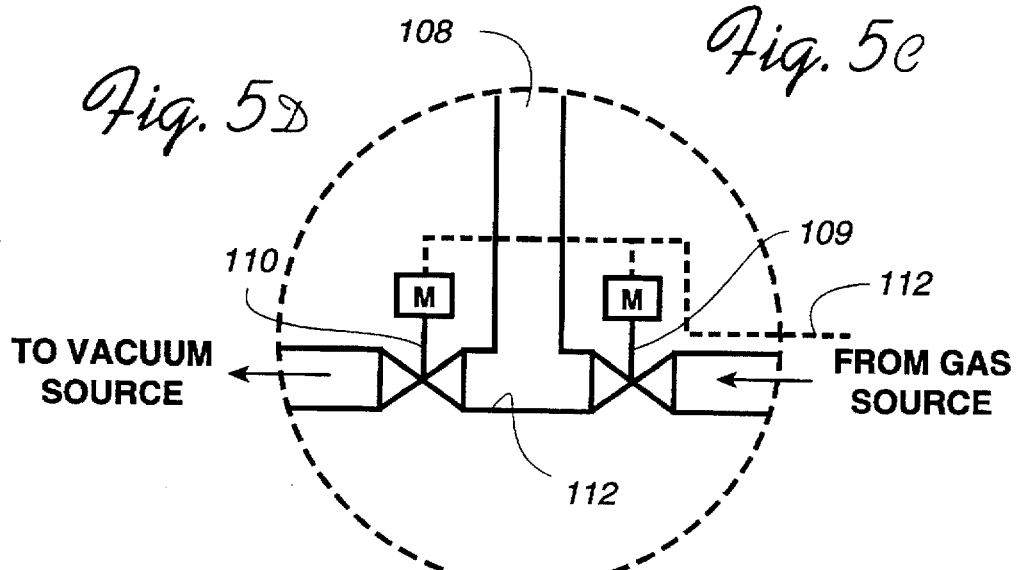
FIG. 5D is a schematic diagram of FIG. 4 showing the use of direct connections from external sources for controlling pressure according to the invention.

Alternate embodiments of the temperature controlling mechanism 75 are shown in FIGS. 5B, 5C, and 5D.

In FIG. 5B the passage connecting to the gas gap 91 (correlating to the passage 76 shown in FIG. 4), is connected to a bellows 90. The bellows 90 has a rigid end connected to a mechanical bellows manipulator 93. The mechanical bellows manipulator is connected between the end of the bellows 90 and a frame around the bellows 92. A motor or other actuator means 94 is connected to the mechanical bellows manipulator such that when the motor or actuator is actuated, the end of the bellows is adjusted according to the control signal 95 from the controller 69. The small compressive deformation in the bellows due to the ambient outside pressure when the bellows is expanded is negligible. The closed system is pressurized and depressurized by changing the closed system volume.

In FIG. 5C a palladium enclosing chamber 101 is sealed to the passage connecting to the gas gap 99 correlating to the passage 76. This palladium enclosing chamber 101 includes palladium medium 100 consisting of readily available sources of palladium which are ideally quite porous such as mesh or porous beads. The configuration of FIG. 5C only works when hydrogen is used as the low molecular weight gas in the gas gap. Hydrogen molecules are very strongly attracted to palladium and at low temperatures (ambient room temperatures, 70° F. (21° C.)) hydrogen molecules selectively attach themselves to palladium surfaces. At low temperatures the adsorption of hydrogen molecules by the palladium will create a vacuum in the gas gap closed system and palladium enclosing chamber 101. To increase the pressure in the gas gap, a set of variably adjustable heating coils 102 are energized to increase the temperature of the palladium 100 and reduce the adsorbance of the hydrogen molecules to the palladium. When the palladium reaches a predetermined temperature (established from empirical tests), most of the hydrogen molecules have, by virtue of their being heated, been driven from the surface of the palladium. High concentrations of free hydrogen molecules in the closed system increase the pressure of gas in the system. Pressures as high as several atmospheres can exist in the gas gap and connecting passages. The temperature of the heating coils 102 which influence the disassociation of the hydrogen molecules from the palladium medium 100 are controlled by a control signal 103 received from the controller 69. Other adsorbing material may be used with Hydrogen or other gases, which are compatible to gain the same result.

The controller 69 is a feedback controller. It automatically adjusts to maintain the temperature of the pedestal 62 at the desired setting and produces control signals which try to maintain this setting even if the temperature of the local heat sink and/or the pressure relationship of the gas (i.e. due to undesired gas leakage) is changed. This very flexible control system does an excellent job in controlling the temperature of the pedestal 62.

Another embodiment of the pressure controlling mechanism 75 is shown in FIG. 5D. In this configuration one of the low molecular gasses previously mentioned or a readily available and economical gas such as nitrogen or argon is used as the thermal transfer gas in a semi-closed system. Two automatic valves 109, 110 surround a tee connection 112 which is connected to the passage connecting to the gas gap 108, correlating to the passage 76 in FIG. 4. The control signal 112 opens the gas inlet valve 109 and closes the inlet valve 110 when pressure is required, and opens the automatic outlet valve 110 and closes inlet valve 109 when the pressure must be reduced. The automatic inlet valve 109 is fed from a gas source, i.e., nitrogen or argon, etc. The automatic inlet valve 109 can be a controllable pressure regulating valve where the pressure setting is adjusted by the controller when adjustment is needed, a full shutoff at the closed position is required. The automatic outlet valve 110 can similarly be a pressure regulating valve, or an on-off valve, which is connected to a vacuum source to provide pressures as low as the vacuum source will accommodate when the gas inlet valve 109 is closed.

Figure 6:
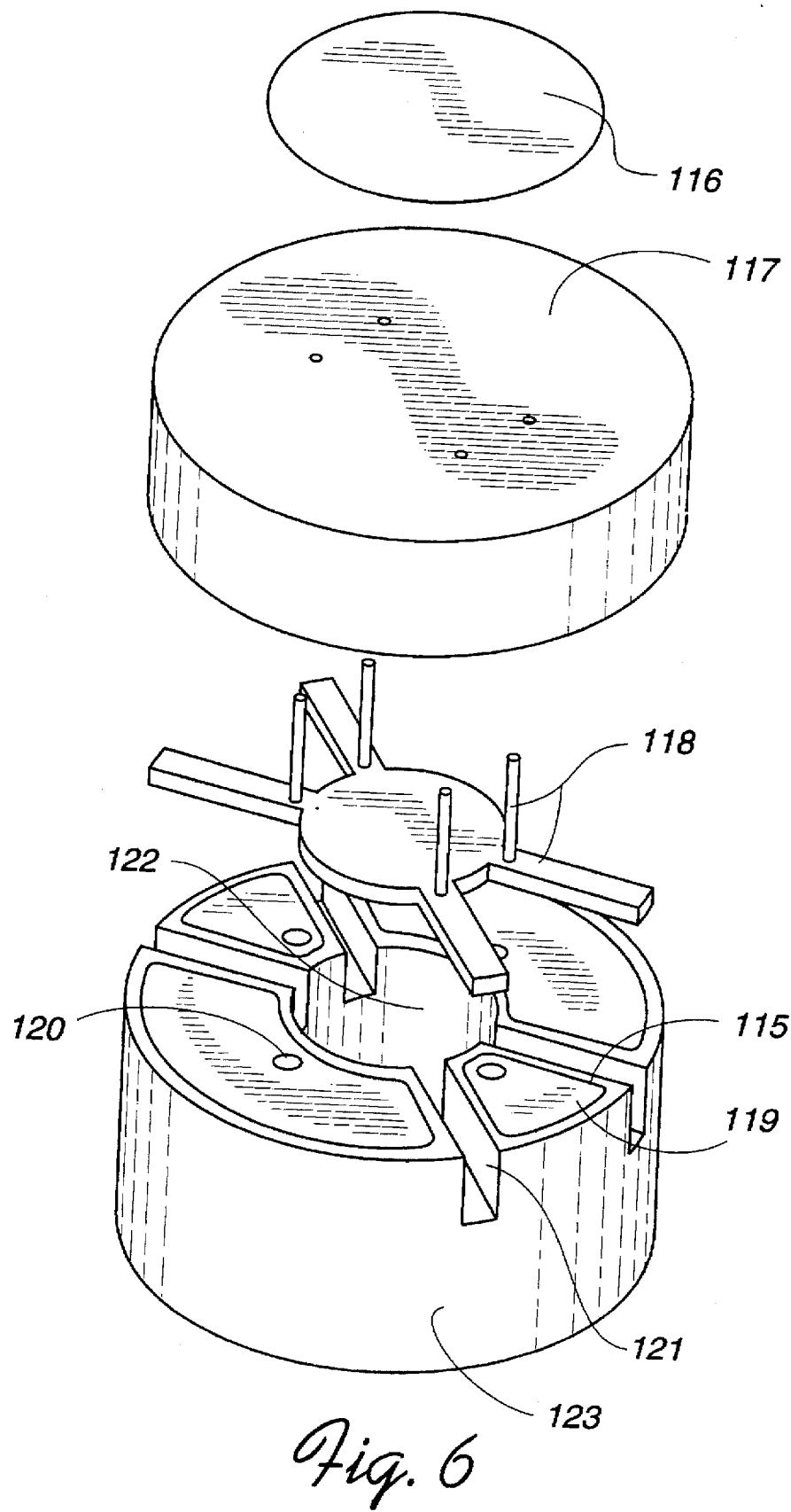
FIG. 6 shows a perspective view of an embodiment according to the invention with the gas gap at the bottom of the pedestal.

One application for this invention is its use in semiconductor wafer processing chambers to assist in controlling the temperature of the pedestal/cathode on which a wafer might rest. A simplified exploded diagram of such a use is shown in FIG. 6. The details and context are discussed in the Background of the Invention. A wafer 116 sits on a pedestal/ cathode 117. Because it is necessary to lift the wafer and handle it when moving it between processes and process chambers, it is necessary to have wafer lift fingers in a frame 118 or similar devices to lift the wafer. When using the conventional wafer lift fingers and frame 118, as shown. It is necessary to have a central or at least axially symmetric means or passage, such as the central bore of the pedestal support 122, to raise and lower the wafer lift fingers and frame 118. The pedestal support base (slug or local heat sink) 123 includes wafer lift cutouts 121 to accommodate the wafer lift fingers and frame 118. Therefore a continuous surface is not available for the gas gap at this level and in this instance four separate surfaces as bounded by O-rings are shown on the top of the sections of the pedestal base between the wafer lift cutouts 121. The gas gap areas 119 on the surface of the pedestal between the wafer lift cutouts 121 are bounded by O-rings 115 which are mounted in grooves or are custom formed to enclose the areas 119. Each gas gap area 119 contains a gas passage to the outside 120. These passages correlate to the gas passage 76 shown in FIG. 4.

Figure 7:
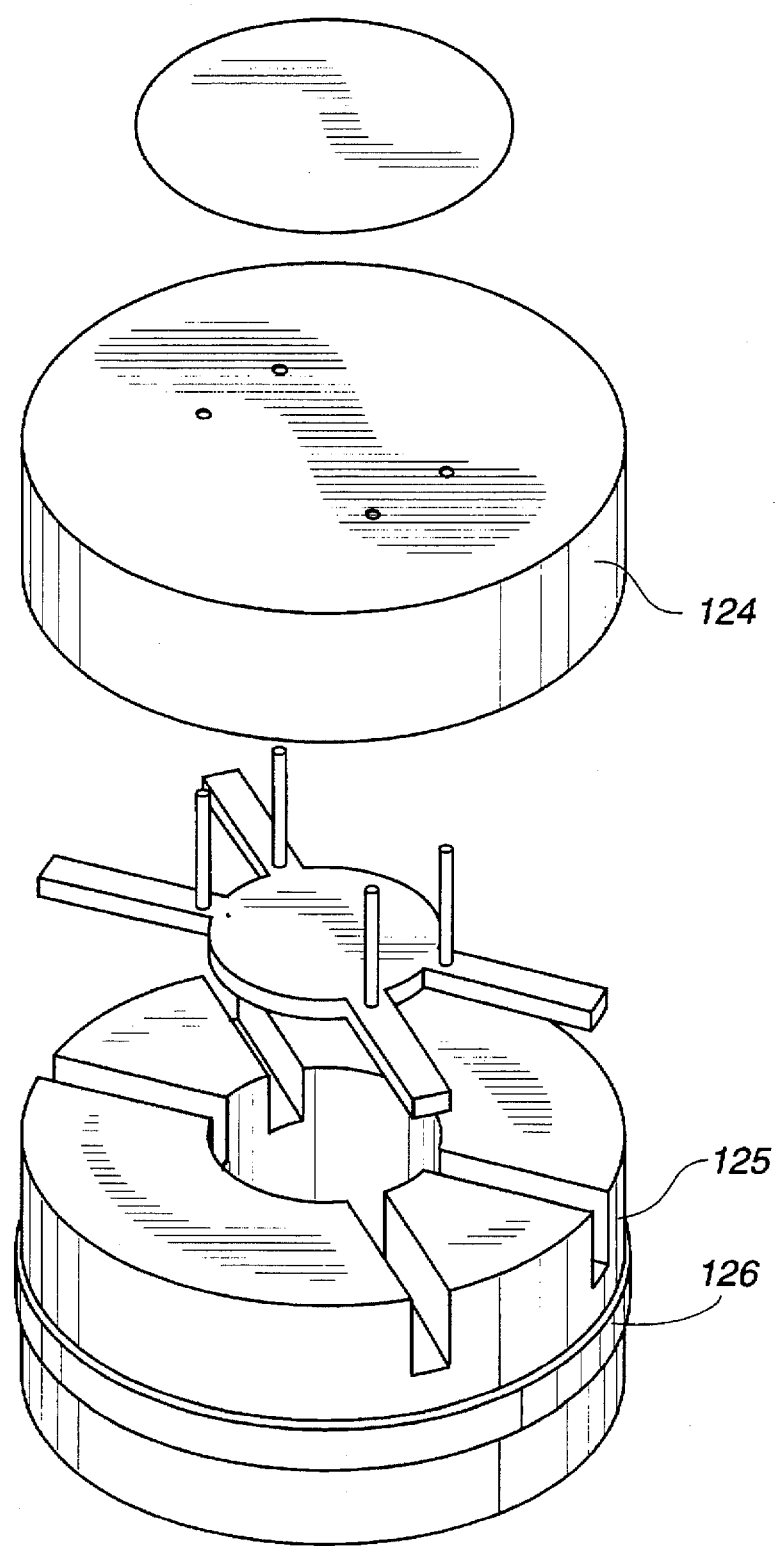
FIG. 7 shows a perspective view of an embodiment according to the invention with the gas gap in the pedestal base.
Figure 8:
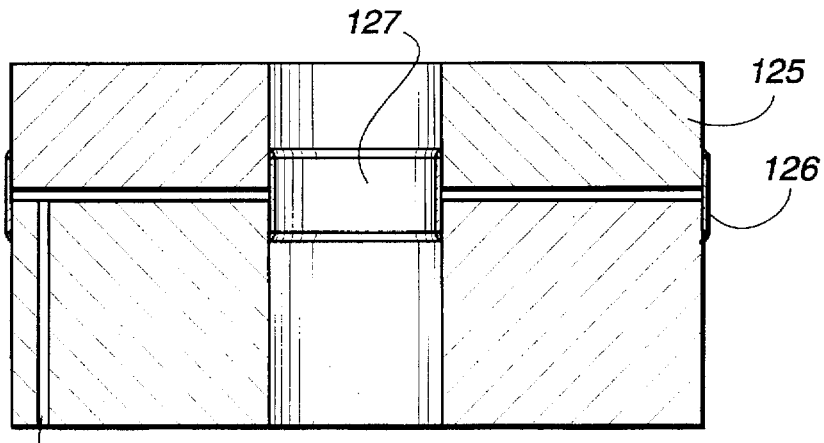
FIG. 8 is a cross-sectional view of the embodiment according to the invention, using a stainless steel band forming a ring that is welded to the pedestal base to seal the gas space.
Figure 9:
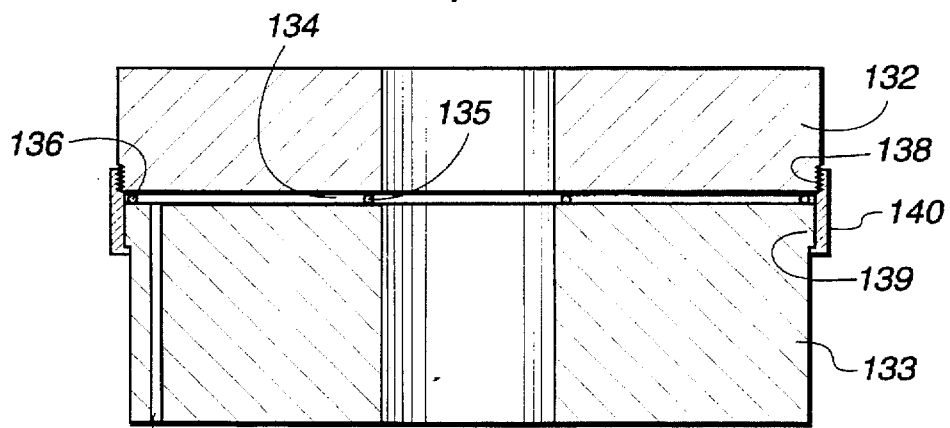
FIG. 9 is a cross-sectional view of an embodiment according to the invention, using O-rings and a threaded ring to seal the gas space in the pedestal base.

FIG. 7 shows an embodiment of the invention locating the gas gap surface below the wafer cutouts 121 (ref. FIG. 6). A two piece pedestal base 125 is provided and a circular sealing ring 126 as pictured in FIG. 8, made of a 3XX series stainless steel is electron beam welded to the outside and inside of the gap to seal it tightly. The 3XX series stainless steels have poor thermal conductivity. Therefore their conduction of energy across the gas gap will be minimal. As can be seen in FIG. 8, the central bore of the pedestal base 125 extends through pedestal base and must also be sealed in order to maintain a gas gap. An inside sealing band 127 is welded to the internal bore by electron beam welding to seal the inside surface of the gas gap. A connecting passage to the gas 128 correlates to the connecting passage 76 as shown in FIG. 4. FIG. 7 also provides a general view of a configuration for a gas gap when sealed by welded stainless steel bands are replaced by O-rings and a threaded connection. The sealing is done as shown in FIG. 9 by O-rings 135, 136 and a threaded section 138 on the upper portion of the pedestal base which has an internally threaded connecting ring (nut) 140 having a lip to catch the pedestal base flange 139 to draw the pedestal base bottom 133 close to and tight with the pedestal base top 132. The connecting passage to gas gap 137 correlates with the passage 76 shown in FIG. 4. The O-rings are preferably made of Viton. No threaded connection at the central bore is required as the O-rings are all compressed by the outer threaded connection.

Figure 10:
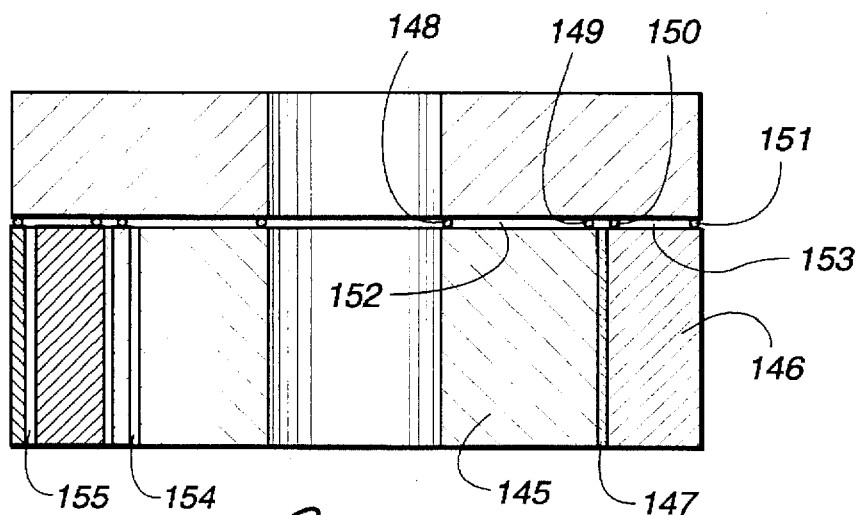
FIG. 10 is a cross-sectional view showing an illustration of adjacent heating and cooling zones in the pedestal base, according to the invention.

In instances where both heating and cooling are desired, rather than only one or the other, alternating areas or regions (metal masses) can be formed in the lower part of the pedestal base to provide cooling and heating regions adjacent to one and another (FIG. 10). The pedestal base upper section is generally the same as in previous embodiments. The pedestal base bottom section, however, consists of two annular sections, a heating section 146 and a cooling section 145. These two members are joined through an insulating section 147 (preferably made of Fiber Frax or other suitable insulating material) and once mated to the upper portion of the pedestal base forms a gas gap section of the inner piece 152 and a gas gap section of the outer piece 153. O-rings 148, 149, 150, and 151 seal the respective gas gap sections. The pedestal base top and bottom portions can be held together by any number of means as previously discussed. A gas passage to the gas gap of the inner pedestal base 154 provides pressure/thermal conductivity adjustment from the cooling pedestal base lower section inner piece 145 and gas passage 155 provides a gas passage to the gas gap of the outer piece 153 which adjusts the thermal conductivity between the pedestal base lower outer heating piece 146 and the pedestal base upper piece. In this configuration pressurizing or depressurizing either of these gas gap space sections 152, 153 will provide heating or cooling to the pedestal base upper section and the control of the thermal conductivity in these gas gap spaces make it possible to achieve any temperature between the two extreme temperatures of local heat source and sink (heated metal section 146 and the cooled metal section 145, respectively). These sections can be heated and cooled by external sources, e.g. separate thermal transfer fluid systems can circulate in these sections to maintain their respective temperatures (not shown). A temperature controller coordinating two or more sections adjusts the gas pressures in the gaps either directly or by providing control signals to other individual section temperature controllers. This configuration provides great flexibility and very tight control on the temperature of the wafer pedestal, especially during transitions between heating and cooling.

Figure 11:
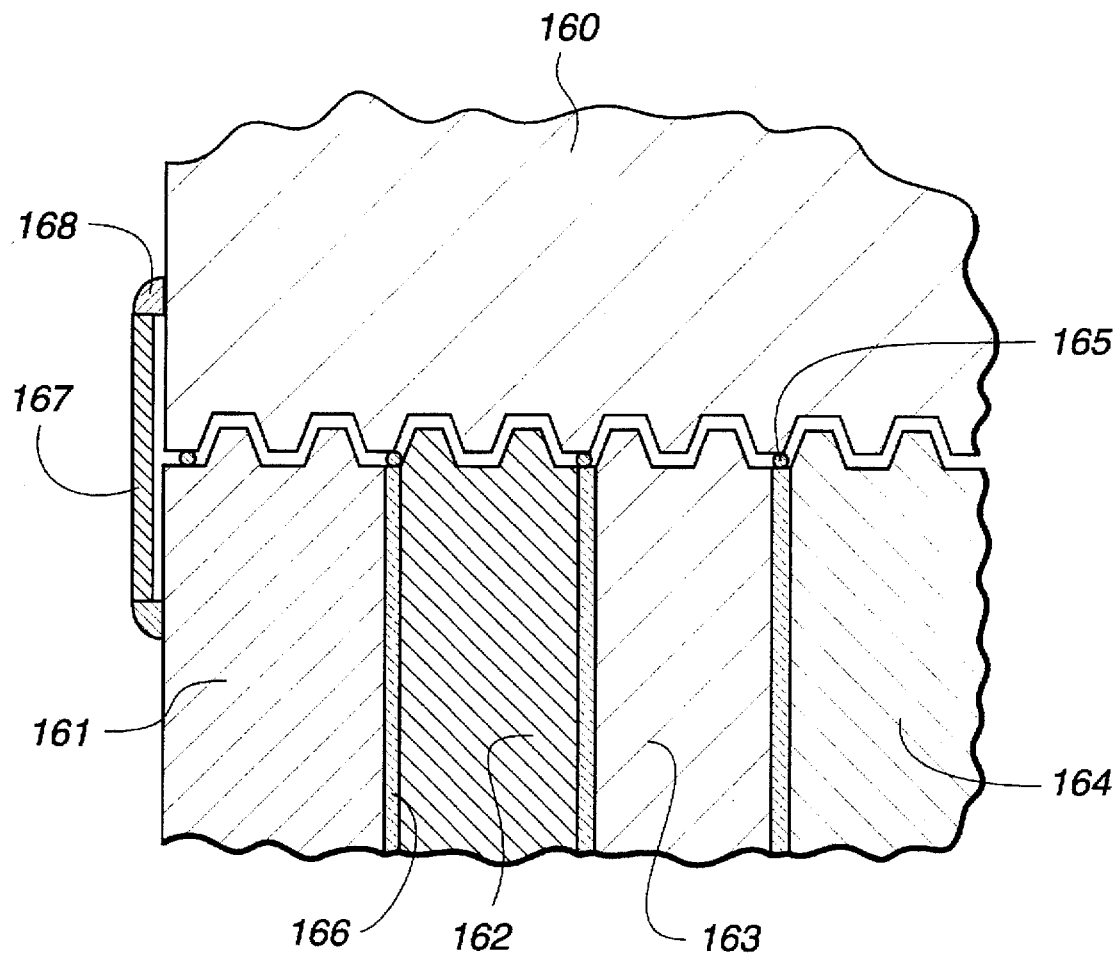
FIG. 11 is a cross-sectional view showing an embodiment of several hot and cold regions adjacent to one another according to the invention.

An alternate embodiment of this transition between heating and cooling is shown in FIG. 11. The pedestal base upper portion 160 is a monolith, as before, having a grooved bottom surface for increased area which mates with a pedestal base bottom portion constructed of alternating heating and cooling sections 161, 162, 163, 164. These heating and cooling sections are separated by insulating layers 166 (constructed for example of Fiber Frax) the gas gap regions are separated by O-rings 165. The alternating heating and cooling regions across the diameter of the pedestal base provide a relatively uniform distribution of heating and cooling sources from the pedestal base when the heating and cooling operations are selected. The various heating and cooling sections must be manifolded together so that all of the heating gas gaps and the cooling gas gaps operate cooperatively. If the passages to the gas gap sections become too long and therefore increase tremendously the volume of the gas in the gas gap cells it may be necessary to have bellows with larger displacements or direct pressure directly from gas sources or directly to vacuum sources to use this configuration. The outside sealing ring shown here is a stainless steel band connecting adjoining pieces by a weld 168 to the corresponding upper and lower sections of the pedestal base. Threaded or clamped connections are several of the other options available in their joining.

While the invention has been described with regards to specific embodiments, those skilled in the art will recognize that changes can be made in form and detail without departing from the spirit and scope of the invention.

I claim:

1. Apparatus for use in a substrate processing chamber, comprising:

a pedestal having a substrate support surface configured to support a wafer for processing, wherein said pedestal is configured to have a first surface opposite said substrate support surface;

a second object having a second heat transfer surface disposed adjacent the first surface so as to define a first narrow gap between a second object portion of said first and second surfaces, said second object having heat exchange fluid passages there through such that thermal transfer fluid circulating through said passages transfers thermal energy between said second object and said fluid when there is a temperature differential between them;

a gas tight seal about said first gap, and confining a gas therewithin;

a first pressure controller communicating with said first gap and controlling the pressure of the gas within said first gay in response to a temperature signal;

a temperature sensor to sense the temperature of said pedestal and to provide said temperature signal to said first pressure controller, said temperature signal being a function of the temperature of said pedestal;

a first source/sink of heat located apart from said pedestal providing a first heat exchange fluid flow to said second object to provide a source/sink supply of thermal energy at a first temperature; exchange fluid flow to said second object to provide a source/sink supply of thermal energy a first temperature;

a third object located adjacent to said second object and insulated from said second object, wherein said third object is also configured to have a third surface located adjacent to said first surface so as to form a second narrow gap between a third object portion of said first and third surfaces, said second object acting as a heat sink and said third object acting as a heat source to facilitate controlling the temperature of the pedestal to a preselected value between respective temperatures of said second and third objects, said third object having heat exchange fluid passages there through such that thermal transfer fluid circulating through said passages transfers thermal energy between said third object and said fluid when there is a temperature differential between them;

a gas tight seal about said second gap, and confining a gas therewithin;

a second pressure controller communicating with said second gap and controlling the pressure of the gas within said second gap in response to said temperature signal; and a second source/sink of heat located apart from said pedestal providing a second heat exchange fluid flow to said third object to provide a source/sink supply of thermal energy at a second temperature.

2. Apparatus as in claim 1 which further includes, a temperature controller coupled to said first and second pressure controllers to control said controllers to increase the pressure within one of said first and second gaps while simultaneously decreasing the pressure in the other of said first and second gaps so as to rapidly attain a preselected temperature for the pedestal.

3. The quasi infinite energy source/sink system for use in a substrate processing chamber, as in claim 1:

wherein said first pressure controller includes bellows being configured to form a portion of a seal sealing a closed sealed volume, the closed sealed volume including said first gap, wherein a first side of said bellows forms a portion of said boundary of said closed sealed volume, wherein a second side opposite said first side is sealed to and enclosed by a bellows enclosing frame, a mechanical bellows manipulator connects between the bellows and said bellows enclosing frame, wherein said mechanical bellows manipulator can expand and compress the bellows to increase or decrease the volume of the closed sealed volume, the bellows enclosing manipulator is controlled by said temperature controller, and wherein the mechanical bellows manipulator adjusts the pressure in the bellows to control the thermal conductivity of the gas in the closed sealed volume.

4. The quasi infinite energy source/sink system for use in a substrate processing chamber as in claim 1:

wherein said gas filling said first gap is adsorptive to gas adsorption material, wherein said first pressure controller includes an adsorptive material enclosing chamber being configured to form a portion of a seal sealing a closed sealed volume, the closed sealed volume including said gas gap, a gas adsorptive material media being disposed in said adsorptive material enclosing chamber, said adsorptive material enclosing chamber being disposed in close proximity to a heating source; and wherein activation of said heating source is controlled by said first temperature controller.

5. The quasi infinite energy source/sink system for use in a substrate processing chamber, as in claim 1:

wherein said second pressure controller includes bellows being configured to form a portion of a seal sealing a closed sealed volume, the closed sealed volume including said second gap, wherein a first side of said bellows forms a portion of said boundary of said closed sealed volume, wherein a second side opposite said first side is sealed to and enclosed by a bellows enclosing frame, a mechanical bellows manipulator connects between the bellows and said bellows enclosing frame, wherein said mechanical bellows manipulator can expand and compress the bellows to increase or decrease the volume of the closed sealed volume, the bellows enclosing manipulator is controlled by said temperature controller, and wherein the mechanical bellows manipulator adjusts the pressure in the bellows to control the thermal conductivity of the gas in the closed sealed volume.

6. The quasi infinite energy source/sink system for use in a substrate processing chamber as in claim 1:

wherein said gas filling said second gap is adsorptive to gas adsorption material, wherein said second pressure controller includes an adsorptive material enclosing chamber being configured to form a portion of a seal sealing a closed sealed volume, the closed sealed volume including said gas gap, a gas adsorptive material media being disposed in said adsorptive material enclosing chamber, said adsorptive material enclosing chamber being disposed in close proximity to a heating source; and wherein activation of said heating source is controlled by said second temperature controller.

7. A quasi infinite energy source/sink system for use in a substrate processing chamber, comprising:
- a component of said chamber whose temperature is to be controlled, said component having a first heat transfer surface;
- a local heat sink disposed adjacent to said component having a second heat transfer surface, a sealed gap being formed between a substantial portion of said first heat transfer surface and a substantial portion of said second heat transfer surface, said gap being filled with a gas, said first heat transfer surface and said second heat transfer surface comprising a substantial portion of the contact between said component and local heat sink;
- a temperature sensor to sense the temperature of said component and provide a signal to a temperature controller, said temperature controller providing a control signal to a pressure control mechanism connected to said gap, said control mechanism controlling the pressure of gas in the sealed gap to control the transfer of thermal energy between the component and the local heat sink; and
- a global heat sink coupled to said local heat sink to provide additional heat sink capacity;
- wherein said local heat sink includes a fluid passage for heat transfer therethrough, said global heat sink supplying said fluid to said local heat sink at a first temperature;
- wherein said pressure control mechanism includes a flexible wall member being configured to form a portion of a seal sealing a closed sealed volume, the closed sealed volume including said gas gap, wherein a first side of said flexible member forms a portion of said boundary of said closed sealed volume, wherein a second side opposite said first side is sealed to and enclosed by a bellows enclosing chamber,
- wherein the pressure in said bellows enclosing chamber outside said closed sealed volume is controlled by a pressure regulator controlled by said temperature controller, and
- wherein the position of the flexible wall member automatically adjusts to pressure changes in the bellows enclosing chamber to make the pressure in the gas gap system substantially equal to the pressure in said bellows enclosing chamber.

8. A quasi infinite energy source/sink system as in claim 7,
- wherein said flexible wall member is a closed bellows connected to and sealed to said sealed volume at one end of said bellows.

9. A quasi infinite energy source/sink system for use in a substrate processing chamber comprising:
- a component of the chamber whose temperature is to be controlled, said component having a first heat transfer surface;
- a local heat source/sink comprising,
  - a local heat sink disposed adjacent to said component, said sink having a second heat transfer surface facing said first heat transfer surface,
  - a local heat source disposed adjacent to said component, said heat source being disposed adjacent to and insulated from said heat sink, said source having a third heat transfer surface facing said first heat transfer surface;
  - a first sealed gap being formed between a substantial portion of said first heat transfer surface and a substantial portion of said second heat transfer surface, a second sealed gap being formed between a substantial portion of said first heat transfer surface and a substantial portion of said third heat transfer surface, said first gap and said second gap being filled with a gas;
- a temperature sensor to sense the temperature of said component and provide a signal to a temperature controller, said temperature controller providing a first control signal to a first pressure control mechanism connected to said first gap and a second control signal to a second pressure control mechanism connected to said second gap, said first and said second control mechanisms control the pressure of gas in said first and said second sealed gaps to control the transfer of thermal energy between the component and said local heat sink and said local heat source.

10. A quasi infinite energy source/sink system as in claim 9, further comprising:
- a global heat sink coupled to said local heat sink to provide additional heat sink capacity
- wherein said local heat sink includes a fluid passage for heat transfer therethrough, said global heat sink supplying said fluid to said local heat sink at a first temperature.

11. A quasi infinite energy source/sink system as in claim 10, further comprising:
- a global heat source coupled to said local heat source to provide additional heating capacity
- wherein said local heat source includes a fluid passage for heat transfer therethrough, said global heat source supplying said fluid to said local heat source at a second temperature.

12. Method for transferring heat to or from a pedestal in a substrate processing chamber, comprising the steps of:
- providing a second object capable of storing heat adjacent the pedestal, said second object being provided with a heat-exchanging surface conforming to a complementary surface of the pedestal;
- positioning said heat exchanging surface closely adjacent the complementary surface of the pedestal so as to define a gap therebetween;
- confining a gas between said heat-exchanging surface and said complementary surface within said gap; and
- increasing or decreasing the pressure of said gas in said gap to increase or decrease the conduction of heat across said gap to maintain the pedestal at a preselected temperature
- varying the pressure of said gas in said gap in response to a control signal;
- sensing the temperature of the pedestal providing said control signal varying as a function of said temperature
- providing a third object having a heat exchanging surface closely adjacent to the complementary surface of the pedestal so as to define another gap therebetween within which is confined a gas
- wherein said third object is cooled, and said second object is heated, and
- wherein the gas pressures within said gaps are respectively increased and decreased in order to rapidly control the pedestal to a temperature between that of said second and third objects.

13. Method as in claim 15 which further includes the step of:
- providing a source/sink of heat located apart from said second object and transmitting thermal energy via a thermal transfer fluid between said second object and said source/sink of heat to maintain said second object generally at a preselected temperature.

* * * * *